United States Patent
Dittmer et al.

(10) Patent No.: US 6,646,504 B2
(45) Date of Patent: Nov. 11, 2003

(54) BROADBAND AMPLIFIER SYSTEM HAVING IMPROVED LINEARITY AND MINIMUM LOSS

(75) Inventors: Timothy Dittmer, Mason, OH (US); George Cabrera, Mason, OH (US); Dmitriy Borodulin, Mason, OH (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 09/932,813

(22) Filed: Aug. 17, 2001

(65) Prior Publication Data

US 2003/0034837 A1 Feb. 20, 2003

(51) Int. Cl.[7] .................................................. H03B 3/45
(52) U.S. Cl. ..................... 330/124 R; 330/284; 330/53; 333/112; 333/119
(58) Field of Search ............................... 330/53, 124 R, 330/284; 333/112, 119

(56) References Cited

U.S. PATENT DOCUMENTS

| | | | |
|---|---|---|---|
| 3,516,024 A | * 6/1970 | Lange | 333/10 |
| 4,868,520 A | * 9/1989 | Terakawa et al. | 330/295 |
| 5,793,253 A | 8/1998 | Kumar et al. | |
| 6,243,038 B1 | 6/2001 | Butler et al. | |

FOREIGN PATENT DOCUMENTS

JP 6091705 * 5/1985

OTHER PUBLICATIONS

Hsieh et al. "A European ISM Band Power Amplifier Module" Radio and Wireless Conference, 2000 RAWCON 2000 pp 239–242.*

* cited by examiner

Primary Examiner—Michael B Shingleton
(74) Attorney, Agent, or Firm—Tarolli, Sundheim, Covell & Tummino L.L.P.

(57) ABSTRACT

An RF wideband amplifier system is provided that includes an M way splitter for receiving an RF input signal and splitting same into M RF signals for respective application to M power amplifier modules PAM-1 to PAM-M that amplify the M signals and apply the amplified M signals to an M way combiner that applies an amplified RF signal to a load. A main controller provides an automatic level control reference signal, representative of the desired output power level of each of the power amplifier modules. Each power amplifier module includes an 2*N way balanced splitter that receives one of the M RF signals and splits the signal into 2*N signal portions; 2*N RF amplifiers that respectively receive the 2*N signal portions and amplify same and provide therefrom 2*N amplified signal portions; an 2*N way RF combiner that receives and combines the amplified RF signal portions and provides therefrom a combined amplified output RF signal; a power detector that provides a power signal representative of the level of the output power of the power amplifier module; a difference circuit that provides an attenuation control signal having a value in accordance with the difference in values of the power signal and the reference signal; and, a variable adjuster that adjusts the magnitude of the one of the M RF signals in accordance with the difference.

13 Claims, 11 Drawing Sheets

US 6,646,504 B2

BROADBAND AMPLIFIER SYSTEM HAVING IMPROVED LINEARITY AND MINIMUM LOSS

TECHNICAL FIELD

The present invention is directed to an RF power amplifier system.

BACKGROUND OF THE INVENTION

RF power amplifiers are known in the art for use in amplifying RF signals for broadcasting purposes, including radio and television. The amplifiers may be employed for broadcasting analog television signals, sometimes referred to as NTSC modulated signals, or digital signals, sometimes known as HDTV or DTV signals.

In the amplification of such RF signals, it is common to split the RF signal to be amplified into portions and then to amplify each portion and re-combine the amplified portions with a target to deliver an RF signal more powerful than a single power amplifier PA portion can produce. This will provide an amplified RF signal for application to an antenna system.

As will be brought out hereinafter with reference to FIGS. 1–9 there may be some level unbalance between RF signals generated by the PA portions resulting from the structures employed in the signal splitter. This unbalance will increase re-combining losses of RF signals generated by the PA portions and therefore, reduce the amount of RF signal delivered by the power combiner to the antenna system. Additionally, this unbalance will also exaggerate intermodulation (IMD) products in the sidebands associated with the transmitted channel.

It has been determined that in order to mitigate the effects related to RF signal unbalance the input splitter should have a broadband frequency response with minimum imbalance between channels while the combiner may remain narrow banded featuring the simplest structure and associated unbalance between channels to be able to exhibit the shortest path to the output and consequently the lowest signal loss.

SUMMARY OF THE INVENTION

In accordance with the invention, an RF wideband amplifier system is provided that includes an M way splitter for receiving an RF input signal and splitting same into M RF signals for respective application to M power amplifier modules PAM-1 to PAM-M that amplify the M signals and apply the amplified M signals to an M way combiner that applies an amplified RF signal to a load. A main controller provides an automatic level control reference signal, representative of the desired output power level of each of the power amplifier modules. Each power amplifier module includes an 2*N way balanced splitter that receives one of the M RF signals and splits the signal into 2*N signal portions; 2*N RF amplifiers that respectively receive the 2*N signal portions and amplify same and provide therefrom 2*N amplified signal portions; an 2*N way RF combiner that receives and combines the amplified RF signal portions and provides therefrom a combined amplified output RF signal; a power detector that provides a power signal representative of the level of the output power of the power amplifier module; a difference circuit that provides an attenuation control signal having a value in accordance with the difference in values of the power signal and the reference signal; and, a variable adjuster that adjusts the magnitude of the one of the M RF signals in accordance with the difference.

BRIEF DESCRIPTION OF THE DRAWINGS

The foregoing and other advantages of the invention will become more readily apparent from the following description of the preferred embodiment of the invention as taken in conjunction with the accompanying drawings which are a part hereof and wherein.

DESCRIPTION OF THE PREFERRED EMBODIMENTS

Before describing the preferred embodiment of the invention herein, reference is first made to a discussion of the prior art as illustrated in FIGS. 1–9.

Figure 1:
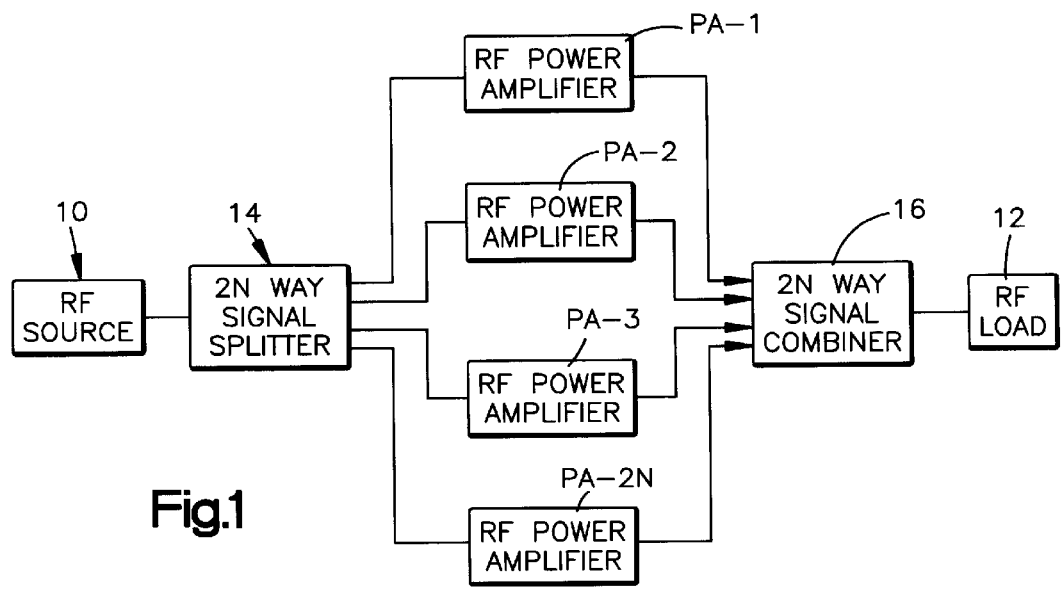
FIG. 1 is a schematic-block diagram illustration of one application of the present invention.

FIG. 1 illustrates a prior art broadband RF amplifier system including an RF source 10 that operates at some power level, such as on the order of 20 watts, and is designed for operation over a broadband frequency range, such as from about 470 MHz to 860 MHz (this being the frequency range within which television signals are transmitted with each television channel in the United States having a bandwidth on the order of 6.0 MHz). This RF signal is boosted in power to, for example, 1 kW before being supplied to an RF load 12. Solid state amplifiers may be employed for increasing the power level. However, there are limitations in the power handling capability of such amplifiers. It is for this reason that it is common to divide the signal to be amplified and apply the divided signals to several paths, each of which includes an RF power amplifier operating at a level of, for example, 250 watts. The amplified signals are then combined and supplied to the load. Such a system is illustrated in FIG. 1 wherein the output from the RF source 10 is supplied to a 2N-way signal divider 14 which then divides the signal and applies the divided signals into 2N paths. In this example, N equals 1, 2, 3 . . . . Thus, there is an even number of divisions and the RF signal is divided into an even number of signal portions, such as 4, where N equals 2. As shown, these signals are supplied to 2N paths which include power amplifiers PA-1 through PA-2N. The amplified signals are then supplied to a 2N-way signal combiner 16 to produce the final output signal at a power level on the order of 1 kW, for example, which is then applied to the RF load 12.

It has been well accepted in the art to design an amplifier system as shown in FIG. 1 with parallel amplifiers with each having a constant gain so that the power supplied to each amplifier is amplified equally before being combined. However, any imbalance of power delivered by power splitter to amplifier inputs will cause corresponding imbalance of amplified power levels and may cause one amplifier to go into compression mode too soon with respect to the rest. This may be better understood with reference to FIGS. 2 and 3 below.

Figure 2:
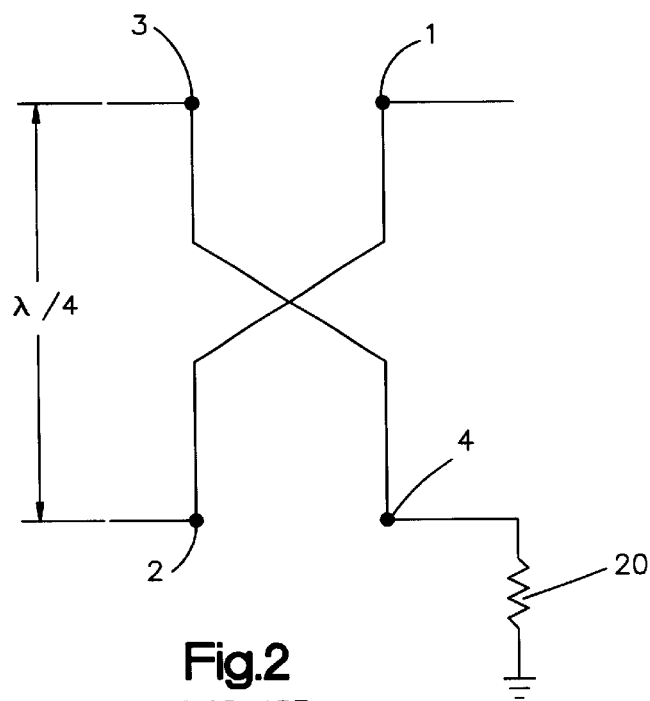
FIG. 2 is a schematic illustration of a single section ninety degree directional coupler which may be employed as either a splitter or a combiner.

FIG. 2 illustrates a ninety degree 3 dB directional coupler which may be employed as either two-way combiner or a two-way splitter. The coupler employs ports 1, 2, 3 and 4. Port 4 is connected to ground by way of a reject load 20. This is considered a single section coupler since each RF transmission path, such as that between ports 1 and 2, is of an electrical length equal to ¼ wavelengths $$\left(\frac{\lambda}{4}\right).$$

Figure 3:
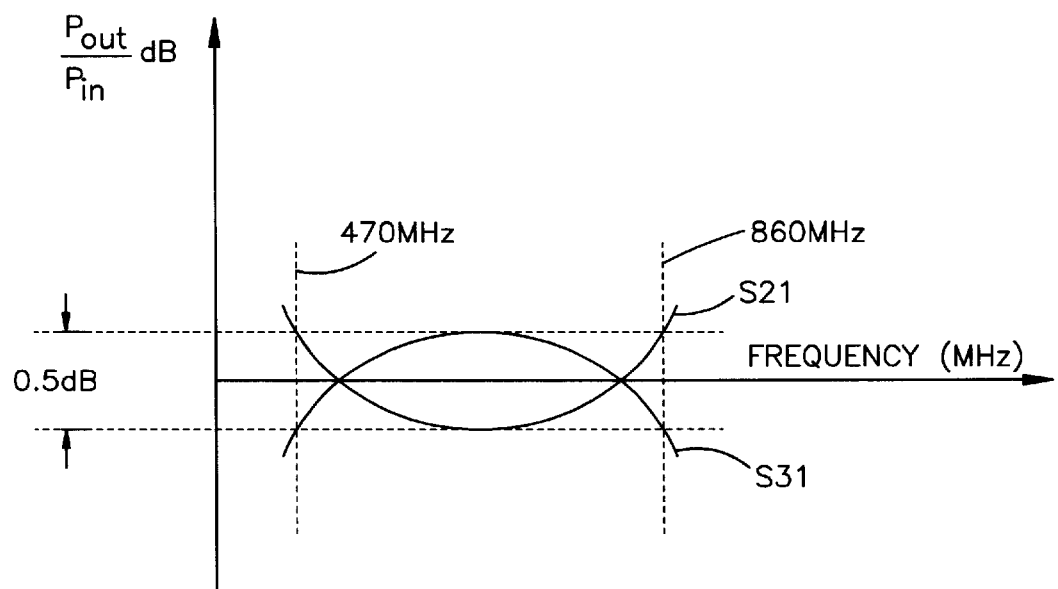
FIG. 3 is a graphical illustration showing the response at ports 2 and 3 to a steady state RF signal supplied to port 1.

Also, the electrical length of the transmission path between ports 3 and 4 is also ¼ wavelength. The transmission paths between the ports are sometimes referred to herein as transmission lines and these may be micro-circuits or waveguides or perhaps coaxial cables, all of which are known in the art as transmission lines. When operating as a signal splitter, input power is supplied to port 1 and it preferably is split equally at ports 2 and 3 with the power at port 2 lagging that at port 3 by ninety degrees. Preferably, nothing is supplied to the reject load 20. However, over a wide frequency range such as from 470 MHz to 960 MHz there will be an imbalance, such as that as illustrated by the waveforms as shown in FIG. 3.

Thus, if a flat or constant power be supplied as an input to port 1 over a frequency range that extends from less than 470 MHz to more than 860 MHz, the power amplitude response at port 2 may take an overcoupled response as represented by curve S21. Similarly, the amplitude response at port 3 may take the form of an undercoupled response as represented by the curve S31. Having −3 dB as a reference level these two responses may deviate by as much as 0.5 dB from each other. Due to reciprocity of the coupler in order to incur no insertion loss over frequency response from port 1 when the coupler is employed as a combiner, the power supplied to port 2 should vary over the frequency range of 470 MHz to 860 MHz in the manner as shown by the curve S21 in FIG. 3. Also, simultaneously with the signal supplied to port 2, the other signal of the same frequency is also supplied to port 3 which level varies over the frequency range of 470 MHz to 860 MHz in the manner as indicated by curve S31. This is the reverse or reciprocal of the operation when the coupler is employed as a splitter which as noted above provides responses in accordance with curves S21 and S31 at ports 2 and 3 in response to constant power applied to port 1 over the frequency range from 470 MHz to 860 MHz.

Figure 4:
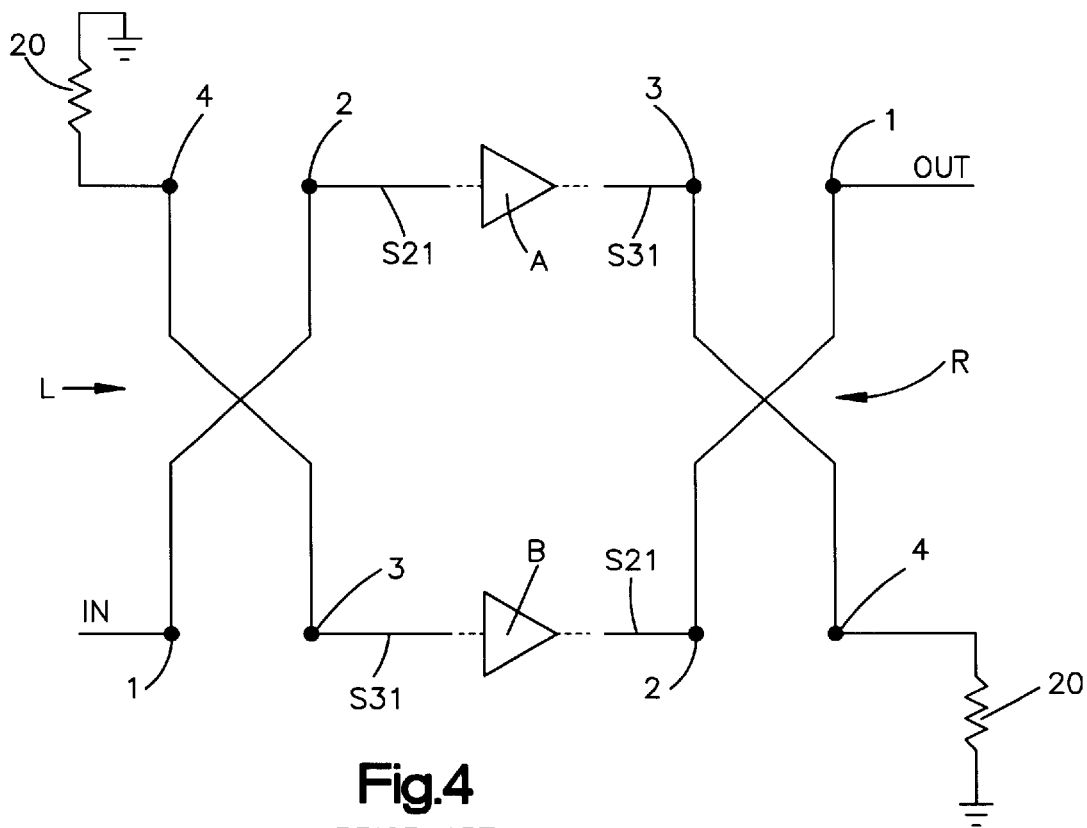
FIG. 4 is a schematic-block diagram illustration of an amplifier system employing a single section two-way splitter feeding a pair of amplifiers which, in turn, feed a single section two-way combiner.

Reference is now made to FIG. 4 which illustrates an amplifier system employing identical ninety degree hybrid couplers in an amplifier system with one coupler being employed on the left side L and serving as a power splitter and the other coupler being employed on the right side R as a power combiner. Again, these are both single section couplers (employing transmission paths that are ¼ wavelength long). As discussed previously with reference to FIGS. 2 and 3, the response of the left side coupler serving as a splitter to steady state power supplied to the input circuit at port 1 will be an overcoupled response S21 (see FIG. 3) at port 2 and an undercoupled response S31 at port 3. Reference is now made to the coupler serving as the two way combiner on the right side R in FIG. 4. As will be recalled from the discussion above relative to FIG. 2, in order to obtain a flat or constant output power at port 1 the power supplied to the combiner input port 2 must have an overcoupled form such as that indicated by waveform S21 in FIG. 3 and simultaneously therewith the power supplied to the input port 3 of the combiner must have an undercoupled form such as that represented by curve S31 in FIG. 3.

Assuming for the moment that the gain of amplifiers A and B are identical, then it is clear that there is an imbalance in the amplifier system of FIG. 4 such that all of the power supplied by output ports 2 and 3 of the input splitter as amplified by the amplifiers A and B will not be supplied to the output circuit as taken at port 1 of the output combiner. Instead, some of the power will be supplied by the combiner at port 4 to the reject load 20. Thus, in this case, the combining efficiency is not 100% but something less even though identical couplers and identical amplifiers have been employed in attempting to amplify the signal over this wide frequency range from 470 MHz to 860 MHz.

The combining efficiency problem noted above with respect to the power amplifier system employing a two-way single section splitter and a two-way single section combiner is further exaggerated when the amplifier system is expanded to a four-way or six-way or eight-way system.

Figure 5:
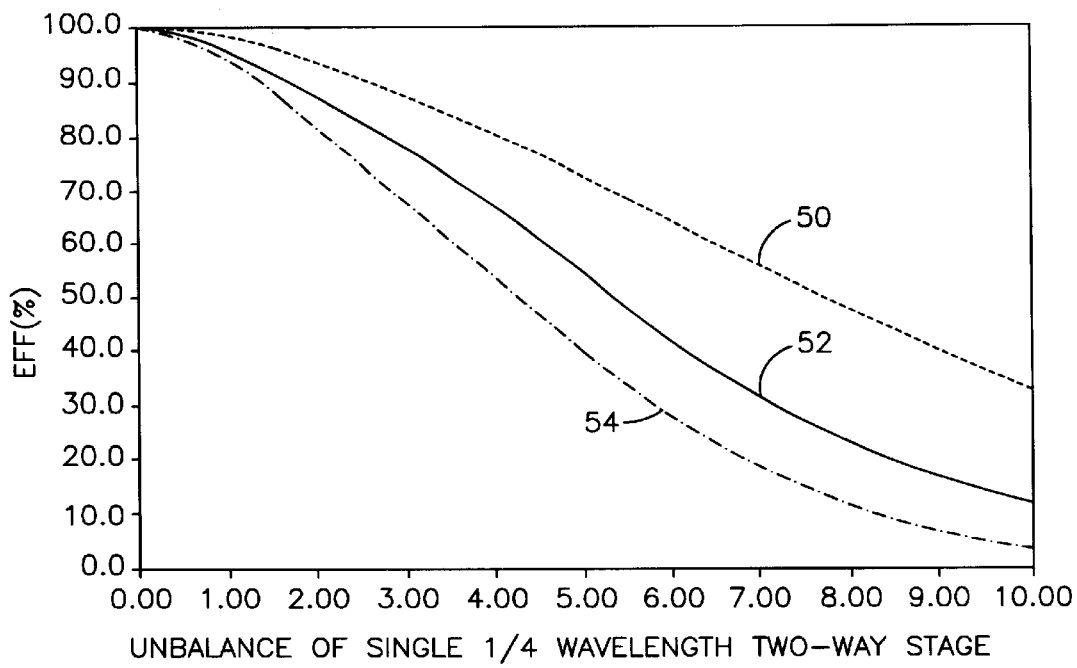
FIG. 5 is a graphical illustration of splitter-combiner efficiency in transferring RF signal from an input to an output as a function of the unbalance of a single section 2-way stage that is used to build 2N-way corporate splitter-combiner structure. The graphs are provided for two-way, four-way and eight-way system.

Reference is now made to FIG. 5 which illustrates combiner efficiency which is defined as $\eta = P_{out}/\Sigma P_{in}$ verses single coupler unbalance (in dB) for a corporate splitter-combiner structure that forms 2N-way amplifier system. Each 2-way stage of the corporate splitter/combiner includes a single section (¼ wavelength) input splitter and a single section output combiner. This is illustrated for a two-way system at curve 50 showing that the efficiency of power transfer from the input to the output decreases as the unbalance increases. Curve 52 is a similar illustration for a four-way system and curve 54 is a similar illustration for an eight-way system.

Figure 6:
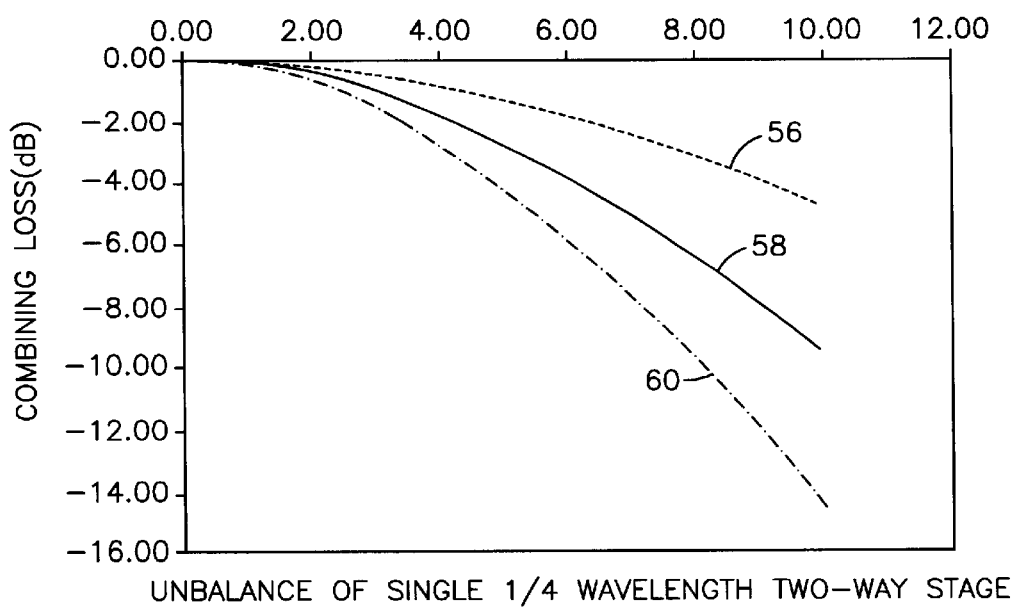
FIG. 6 is a graphical illustration showing combining losses as a function of unbalance of a single 2-way section that is used to build the corporate 2N-way splitter-combiner structure. The graphs are provided for two-way, four-way and eight-way splitter-combiners.

Reference is now made to FIG. 6 which illustrates combining loss due to unbalance. Curves 56, 58 and 60 are for a two-way system, a four-way system, and an eight-way system.

Intermodulation Products (IMD)

Figure 7:
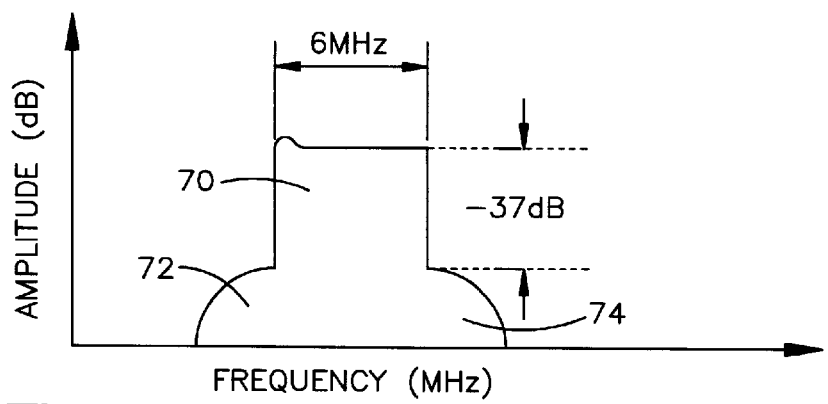
FIG. 7 is a graphical illustration of RF signal power spectrum on the output of power amplifier showing a typical $3^{rd}$ order IMD spectral performance for a DTV signal.

In the United States the television channels are all six MHz wide whereas in other parts of the world the channels may be between 6 and 8 MHz wide. FIG. 7 herein at curve 70 illustrates amplitude with respect to frequency spectrum of a television channel. The FCC in the United States has required that the sidebands 72 and 74, which contain intermodulation products, (IMD) be maintained at a level of at least −37 dB. The IMD products are sometimes referred to herein as third order intermodulation products. These are the result of the non-linearities of the power amplifiers, such as amplifiers A and B in FIG. 4. The IMD products become even more exaggerated due to any unbalance in the splitter-combiner structure as discussed previously.

Consider an amplifier system consisting of plurality of sub-amplifiers, such as A and B in FIG. 4, operating in parallel to deliver output power equal to the sum of the powers generated by each amplifier. There will be unbalance between the RF powers generated by these sub-amplifiers. That unbalance follows the unbalance of the power splitter outputs.

The unbalance of power levels delivered by the sub-amplifiers at the fundamental frequency band of operation will cause corresponding unbalance of intermodulation products originated by the sub-amplifiers. The amount of intermodulation products depends on the degree of non-linearity of amplifier Pout vs Pin transfer characteristic.

Figure 8:
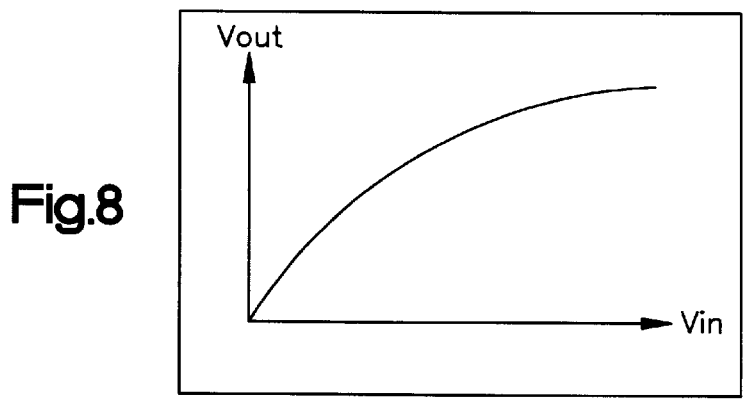
FIG. 8 is a graphical illustration of voltage of RF signal on the output of power amplifier (Vout) with respect to voltage of RF signal on the input (Vin)

Note the curve of $V_{out}$ vs $V_{in}$ in FIG. 8. Typically, gain non-linearity is only modeled as third-order behavior, that is, $$V_{out}=k_1 V_{in}+k_3 V_{in}^3 \qquad \text{Equation 1}$$

The amplitude of third order intermodulation products derived from this equation will be $$V_3=¾k_3 V_{in}^3 \qquad \text{Equation 2}$$

While the fundamental frequency components amplitude is $$V_1=k_1 V_{in}+¾k_3 V_{in}^3 \qquad \text{Equation 3}$$

For k3<<k1 the second term in the last equation can be omitted. Therefore, $$V_1 \approx k_1 V_{in} \qquad \text{Equation 4}$$

Or, in logarithmic terms $$log(V_3)=3log(¾k_3 V_{in})=3log(¾k_3)+3log(V_{in})=a+3log(V_{in}), \text{Equation 5}$$

where $a=3log(¾k_3)$.
Replacing $log(V_3)$ with $V_3(dB)$ and $3log(V_{in})$ with $V_{in}(dB)$ results in $$V_3(dB)=a+3V_{in}(dB) \qquad \text{Equation 6}$$

The same modification for V1 will derive $$V_1(dB)=b+V_{in}(dB), \qquad \text{Equation 7}$$

where $b=log(k_1)$.

The derived equations are commonly considered as an approximation for low level non-linear distortions of RF amplifiers operating with mild degree of compression. As it can be seen $V_3(dB)$ change rate with $V_{in}$ is 3 times higher than for $V_1(dB)$. That means that every time the output voltage changes 2 times the corresponding level of intermodulation distortions expressed in dBm will change 6 times.

Consider a system of 2*N amplifiers that run in parallel and have a 2*N-way splitter on the input and 2*N-way combiner on the output. Let's imagine that the input splitters have unbalance between channels and delivers unequal RF drive levels to the inputs of the amplifiers. That will cause the amplifiers to generate different output RF signals including power at the fundamental frequency band and level of third order IMD sidebands. The amplifier that delivers higher power will consequently have a higher level of distortions.

The total signal on the output of each of the amplifiers will contain spectrum of frequency components including fundamental and third order IMD sidebands. The RF drive unbalance on the input will translate to the same unbalance of the fundamental frequencies on the output of the amplifiers and 3 times more unbalance for the logarithmically scaled intermodulation components.

Let's make the amplifier gain equal each other and equal unity for now, then the output voltages of the amplifiers will be determined by only two splitting coefficients $C_1$ and $C_2$. Then the voltage $V_\Sigma$ on the output port of combiner can be calculated as:

$$V_\Sigma=V_{in}*2^{n}*(C_1 C_2)^n \qquad \text{Equation 8}$$

Where n is number of splitting/combining stages. Introducing k as measure of unbalance introduced by a single 2-way stage:

$$k=C_1/C_2, \qquad \text{Equation 9}$$

it can be shown that the transfer function of corporate n-way single sectioned splitter-combiner system is:

$$V_\Sigma/V_{in}=2^{n}*(k/(k^2+1))^n \qquad \text{Equation 10}$$

FIG. 6 illustrates this formula for n=1, 2 and 3.

In order to maintain $V_\Sigma$ at the "no loss" level the RF signal on the input to the splitter needs to be increased. The amount of input voltage added to compensate for loss will be:

$$V_{in}/V_\Sigma=[(k^2+1)/(2*k)]^n \qquad \text{Equation 11}$$

That will consequently increase the power generated by the power amplifiers and corresponding distortion levels. The consequent IMD level increase will be $$\Delta_{IMD}=[(k^2+1)/(2*k)]^{3n} \qquad \text{Equation 12}$$

In the case of a single section 2-way corporate structure with 2 dB unbalance between amplifiers:

$$\Delta_{IMD}(dB)=0.23 \, dB*3=0.69 \, dB \qquad \text{Equation 13}$$

For the case of 4 amplifiers consolidated with a 4-way splitting/combining system, the IMD increase will be 2 times higher $\Delta_{IMD}(dB)=1.38$ dB. Every 2-way stage addition to corporate combining structure will add another 0.69 dB to the final IMD level.

Figure 9:
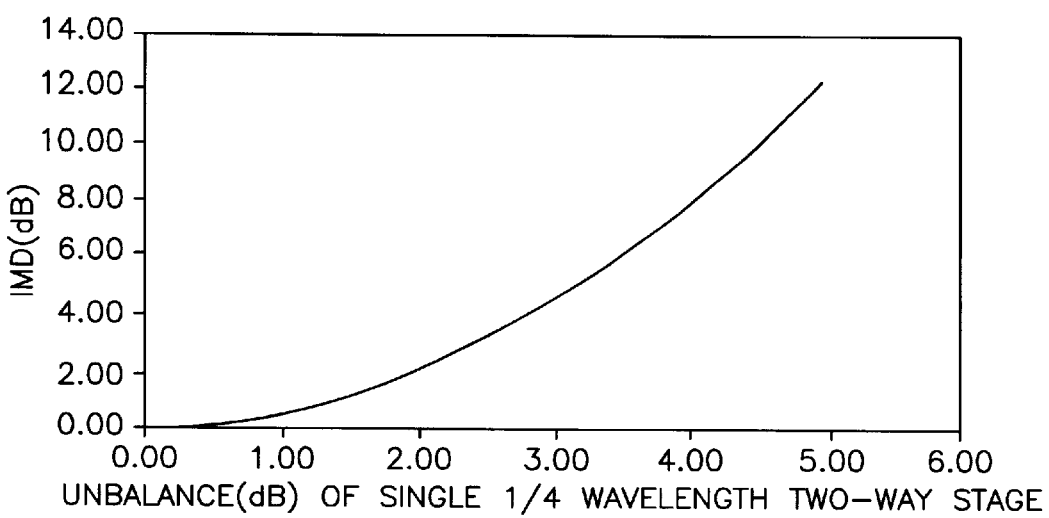
FIG. 9 is a graphical illustration of increase in level of $3^{rd}$ order intermodulation (IMD) products on the output of power amplifier which contains eight-way amplifier structure with a single section 2-way corporate stages in input splitter and output combiner.

Reference is now made to FIG. 9 which is a graphical illustration of the intermodulation products (IMD) with respect to an eight-way corporate amplifier system having a single section input splitter and a single section output combiner based on that as illustrated and described hereinbefore with reference to FIG. 4. In this illustration, it is noted that as the unbalance increases, the intermodulation products (IMD) increase.

An Embodiment of the Invention

From the foregoing discussions relative to FIGS. 1–9, it is apparent that to obtain a balanced system compared to the unbalanced systems as noted above, it is necessary that the input splitter not be identical to the output combiner. To avoid the unbalance response as noted in FIG. 3, an input splitter should have a "flat" response over the frequency range of interest, such as from 470 MHz to 860 MHz. Such a "flat" response may take the form as illustrated with the response curves in FIG. 10. Here the overcoupled response, as represented by curve S21, is separated from the undercoupled response as represented by curve S31 by an unbalanced of no more than 0.1 dB. Whereas the response curves are shown as having multiple instersections, this is not necessary as both response curves could approach each other but never cross so long as the two responses stay within approximately 0.1 dB over the frequency range of interest from 470 MHz to 860 MHz.

Figure 10:
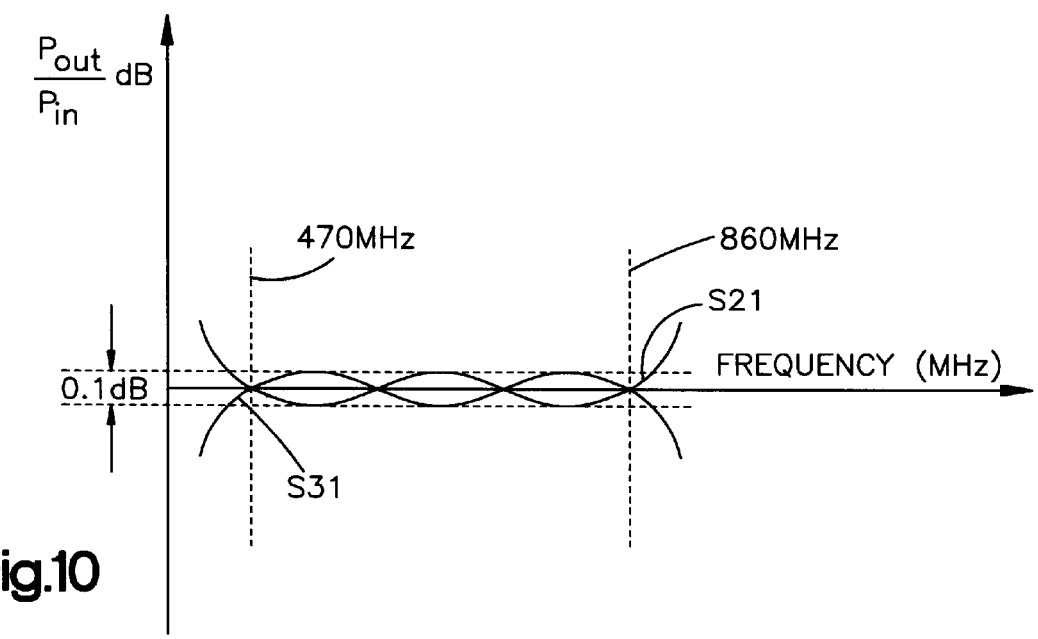
FIG. 10 is a graphical illustration of amplitude with respect to frequency showing a flat wideband splitter response.
Figure 11:
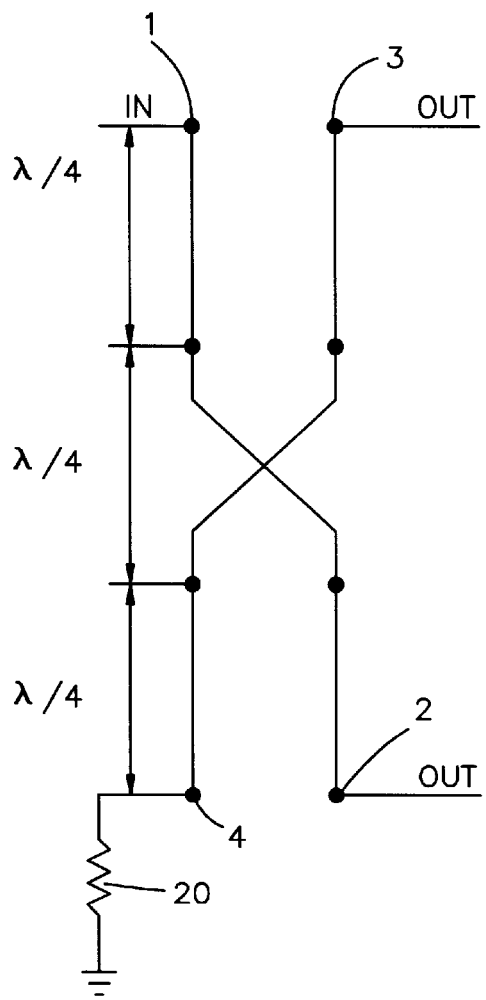
FIG. 11 is a schematic illustration of a three section two-way signal divider that is preferably employed as a 2-way splitter herein.

Reference is now made to FIG. 11 which illustrates an input splitter constructed in accordance with the present invention to achieve the flat response as illustrated in FIG. 10. This input splitter is a three section splitter. The transmission path between ports 1 and 2 is three quarter wavelengths long and the transmission path between ports 3 and 4 is three quarter wavelengths long. This is a three section, two-way splitter. When combined in an amplifying system with a two-way single section output combiner a "flat" response results, such as that shown in FIG. 10. The following describes why a multi-section 90-degree directional coupler will increase broadbandness and will reduce unbalance between channels.

It is known that coupling coefficient C for a multi section quarter wavelength directional coupler can be described as:

$$C(\theta)=C_1 \sin(n\theta)+(C_2-C_1)\sin[(n-2)\theta]+ \ldots +(C_i-C_{i-1})\sin(n-2i+2)\theta+ \ldots +[C_{[(n+1)/2]}-C_{[(n-1)/2]}]\sin\theta \quad \text{Equation 14}$$

Where $\theta=\pi f/f_0$, n—number of sections, $C_1 \ldots C_n$—midband coupling coefficients corresponding to each section.

It follows from this equation that for a number of sections n=1:
$C(\theta)=C_1 \sin(\theta)$
And for n=3, $$C(\theta)=C_1 \sin(3\theta)+(C_2-C_1)\sin[\theta] \quad \text{Equation 15}$$

Figure 12:
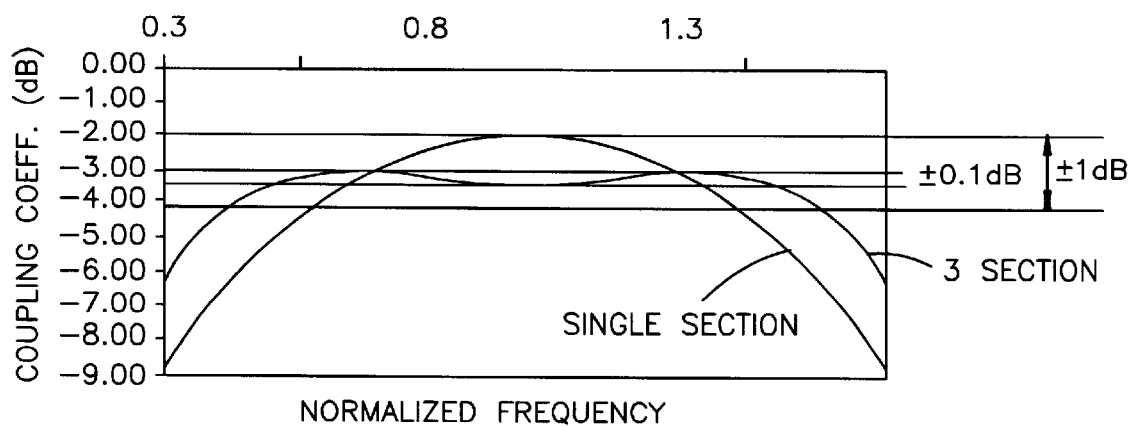
FIG. 12 is a graphical illustration of response curves for single section two-way and 3 section two-way splitters.

FIG. 12 is a graph representing both equations 14 and 15: The graph in FIG. 12 shows a coupler response only for one output of a two-way splitter. The other output's response will be symmetrical relative to the −3 dB line. From here it can be seen that a 3-section coupler has a much smaller unbalance for the same frequency range.

Figure 13:
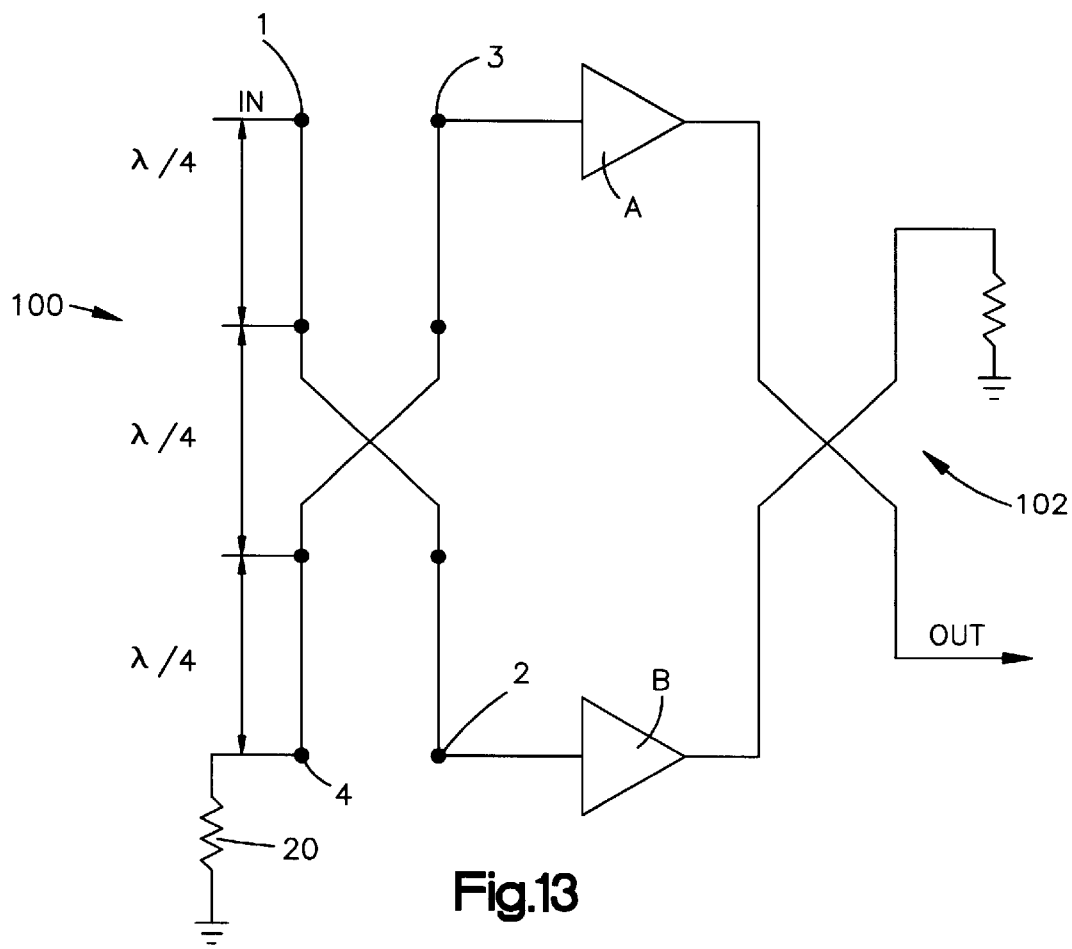
FIG. 13 is a schematic-block diagram illustration of an amplifier system employing a three section two-way splitter feeding a pair of amplifiers which in turn feed a two-way single section output combiner.

Reference is now made to FIG. 13 which illustrates an amplifier system employing a three section two-way splitter and a single section two-way output combiner constructed in accordance with the present invention. This is based on the schematic of FIG. 11. This includes an input three section two-way splitter 100 feeding a pair of amplifiers A and B which in turn feed a single section two-way output combiner 102. The input splitter is constructed as described with reference to FIG. 11 and the output combiner 102 is constructed in accordance with that as illustrated on the right side R of FIG. 4.

Figure 14:
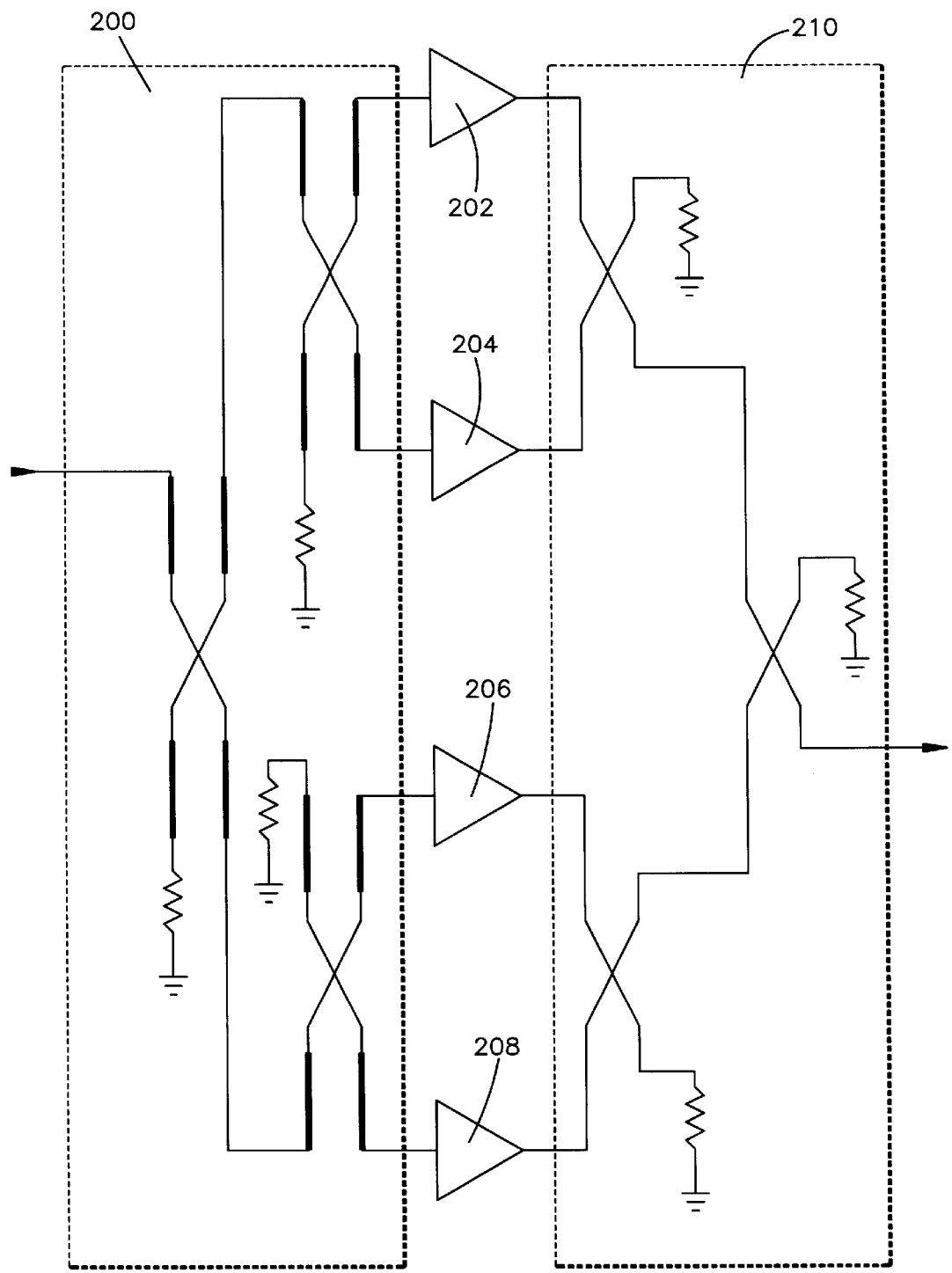
FIG. 14 is a view similar to that of FIG. 13 but illustrating a four-way wideband amplifier system.

Reference is now made to FIG. 14 which illustrates a four-way wideband amplifying system employing a four-way splitter 200 feeding four amplifiers 202, 204, 206 and 208 which, in turn, feed a four-way combiner 210. The splitter 200 is comprised of an input three section splitter constructed as shown in FIG. 13 and which feeds a pair of three section splitters, each constructed as the splitter 100 in FIG. 13. The amplifiers feed two four-way single section combiners each constructed as the combiner 102 in FIG. 13. These combiners, in turn, feed an output single section combiner, also constructed in the same manner as combiner 102 in FIG. 13.

Figure 15:
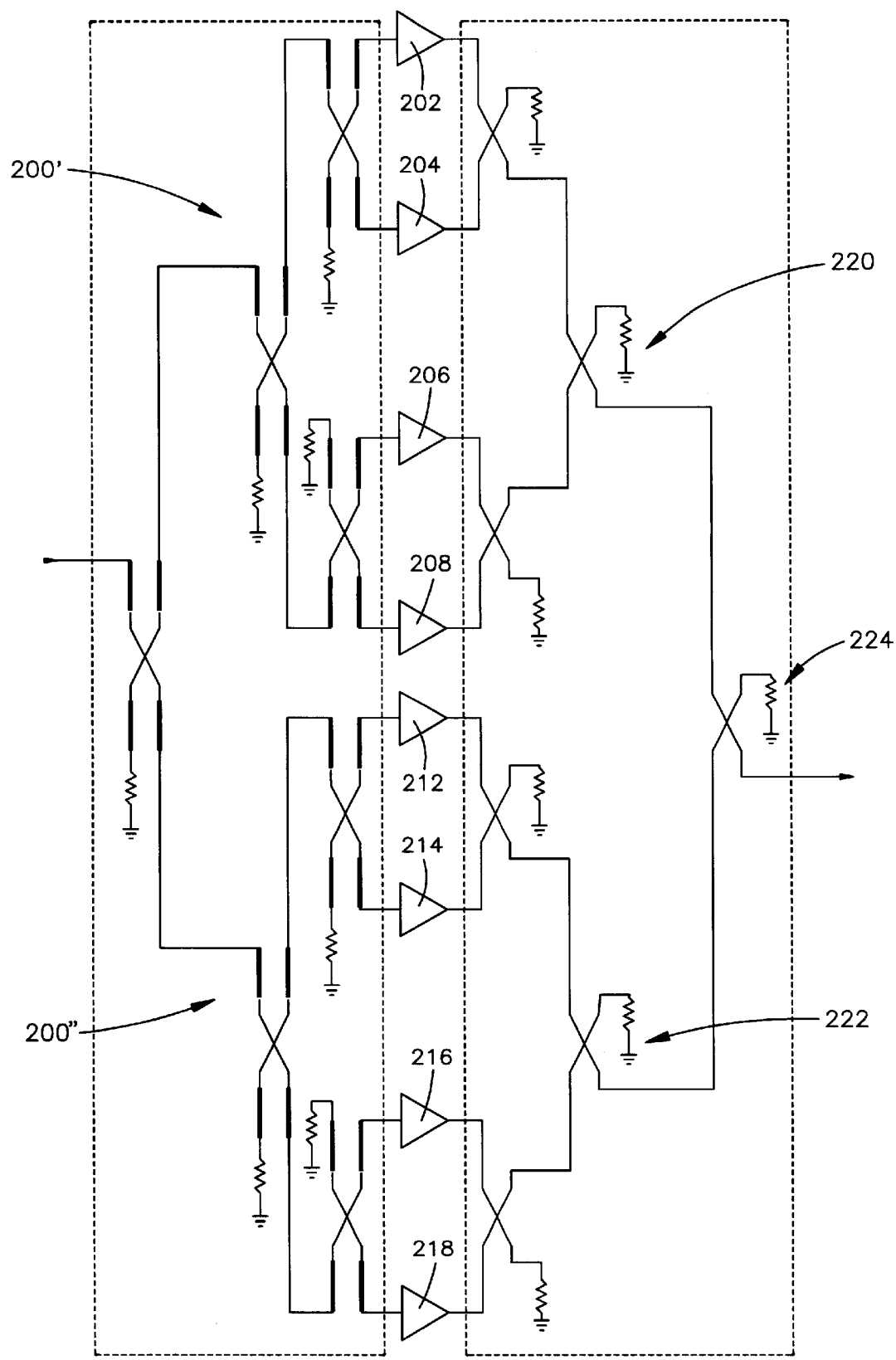
FIG. 15 is a schematic illustration similar to that of FIG. 13 but showing an eight-way wideband amplifier system employing three section two-way splitters.

Reference is now made to FIG. 15 which illustrates an eight-way wideband amplifier system employing a three section input splitter that feeds a four-way splitter 200' constructed in the same manner as splitter 200 in FIG. 14 and another four-way splitter 200" constructed in the same manner as splitter 200 of FIG. 14. These splitters 200' and 200" feed eight amplifiers 202, 204, 206, 208, 210, 212, 214 and 216. Amplifiers 202–208 feed a single section four-way combiner 220 constructed in the same manner as combiner 210 in FIG. 14. Amplifiers 212–218 feed a second single section four-way combiner 222 constructed in the same manner as combiner 210 in FIG. 14. Combiners 220 and 222 feed a single section two-way output combiner 224 constructed in the same manner as output combiner 102 in FIG. 12.

The three section splitters in the embodiments illustrated in FIGS. 11 and 13 through 15 which all operate in conjunction with at least one single section output combiner, and provide the flat response as indicated in FIG. 10 over a frequency range from approximately 470 MHz to 860 MHz.

IMD Level Improvement

Reference is again made to FIG. 9 which illustrates the IMD level increase for an eight-way amplifier system employing single section input splitters and single section output combiners in an eight-way structure. This is to be compared with the operation that takes place with an eight-way structure employing balanced input splitters as shown, for example, in FIG. 15. This is to be contrasted with that as illustrated in FIG. 15 and as described below.

For the case of a balanced input splitter:

$$V_\Sigma=V_{in}*2^{-n/2}*(C1+C2)^n \quad \text{Equation 16}$$

Therefore, $$V_\Sigma=V_{in}*2^{-n/2}*[(k+1)/\sqrt{k^2+1}]^n \quad \text{Equation 17}$$

And IMD level increase will be defined by formula:

$$\Delta_{IMD}=2^{3n/2}*[(\sqrt{k^2+1})/(k+1)]^{3n} \quad \text{Equation 18}$$

Figure 16:
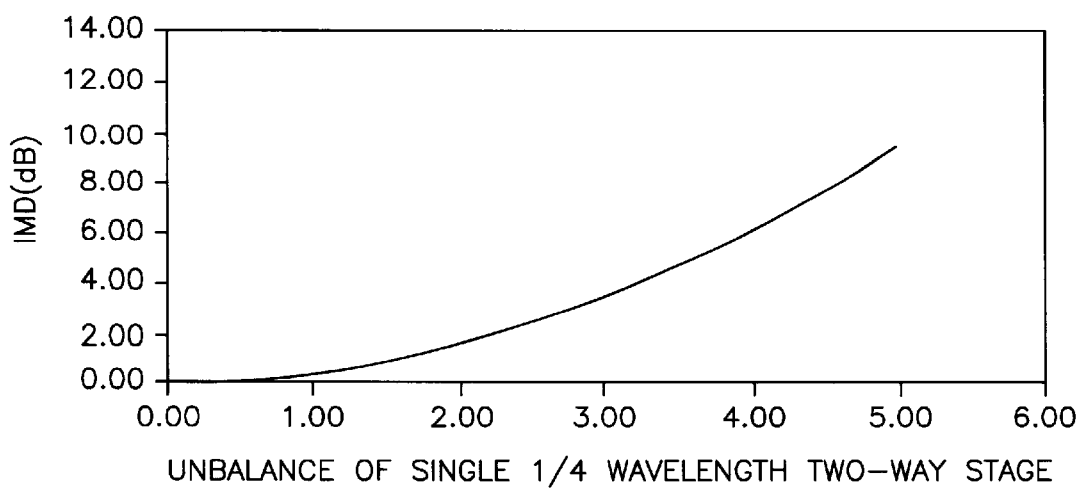
FIG. 16 is a graphical illustration of improvement of level of $3^{rd}$ order intermodulation products (IMD) calculated for a case of 8-way power amplifier system. Improvement comes as a result of employing wideband splitter to balance PA output signals.

The difference between this expression and equation 12 can be considered as IMD improvement achieved as a result of balancing of the amplifier power levels. The graph of FIG. 16 illustrates the improvement as a function of unbalance of two-way single section stage.

Other Balanced Input Splitters

The discussion thus far has been with reference to balanced input splitters such as those illustrated in FIGS. 11, 13, 14 and 15. Those balanced input splitters all include multi-section splitters each including three or more quarter wavelength sections. A balanced splitter may also be obtained from a ferrite based directional coupler. Another case may be a two-way ninety degree splitter, based on a wideband ferrite transformer with discrete components connected to the outputs to organize a wideband phase shifting network. For wideband operations, such as from 470 MHz to 860 MHz, the invention contemplates that balanced input splitters be used.

Such balanced input splitters preferably have a response such as that as illustrated in FIG. 10 which shows that the response to a steady state or flat input signal supplied to input port 1 is a relatively flat response at ports 2 and 3 over the wideband range, such as from 470 MHz to 860 MHz. Moreover, the flat responses at the output ports 2 and 3 are fairly close in magnitude to each other.

Automatic Level Control (ALC) Embodiment

Figure 17:
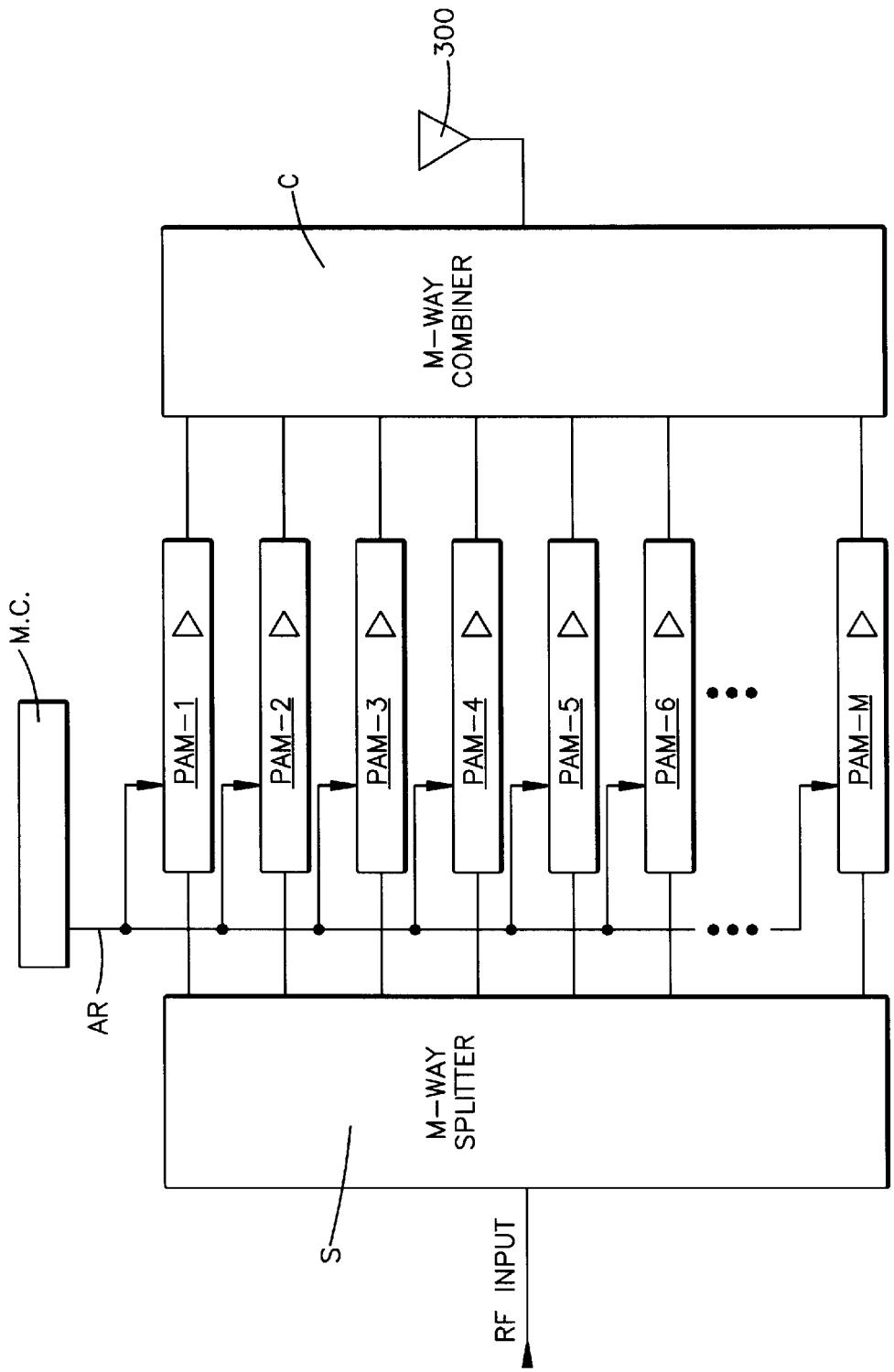
FIG. 17 is a schematic illustration of a system employing the invention herein; and, FIG. 18 is a schematic illustration of a circuit employed in the system of FIG. 17.
Figure 18:
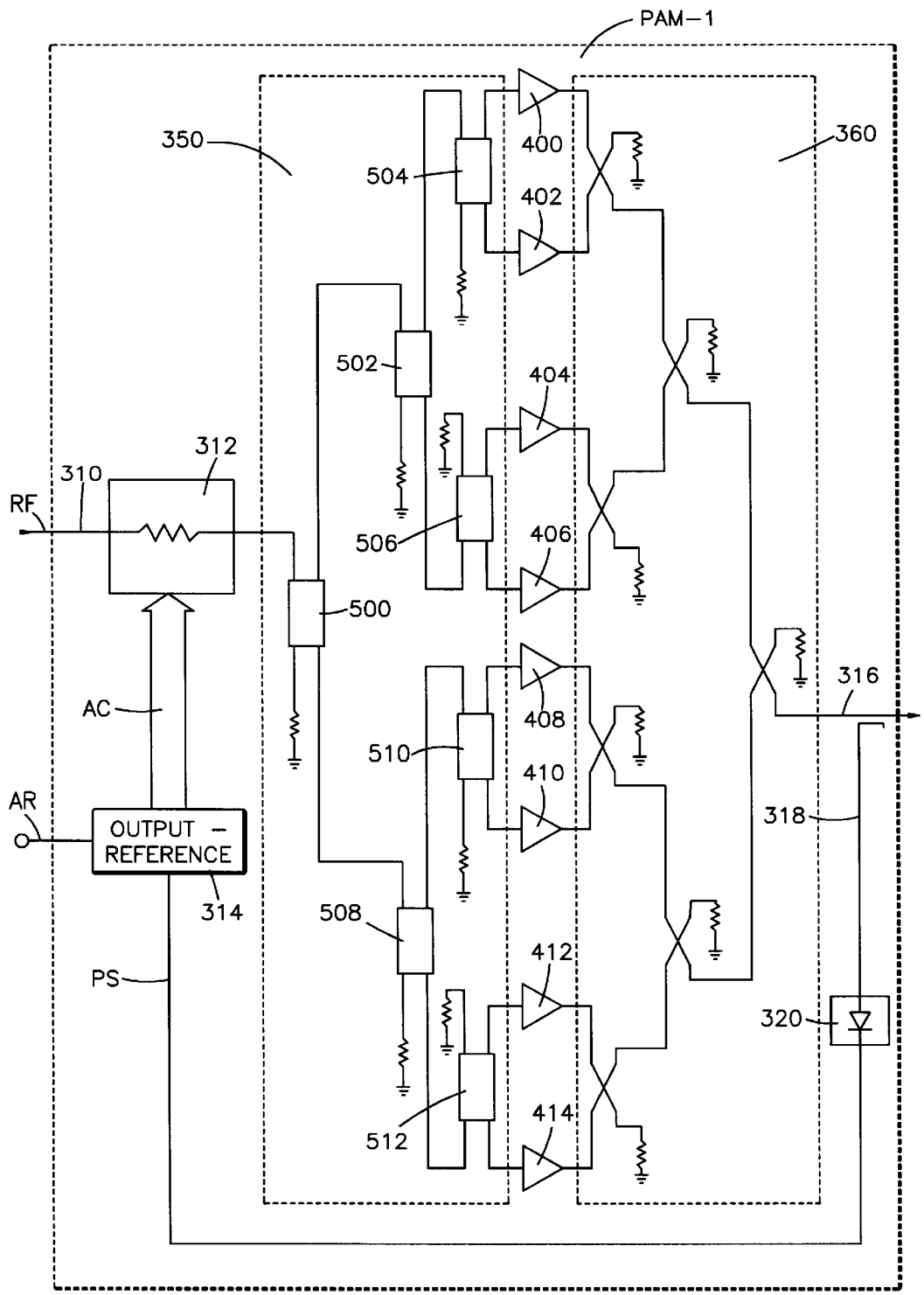

Reference is now made to FIGS. 17 and 18 which illustrate an RF amplifier system in accordance with the invention. The system includes a plurality of power amplifier modules PAM-1 through PAM-M, each of which takes the form of the power amplifier module PAM-1 illustrated in detail in FIG. 18. A splitter S takes the form of a simple M-way splitter and this splitter may be unbalanced. The splitter receives an RF input and divides the input signal into M portions which are then applied to respective power amplifiers PAM-1 through PAM-M where each signal portion is amplified and supplied to an M-way combiner C that recombines the amplified portions and supplies a combined output signal to a load, such as an antenna 300.

The system includes an automatic level control (ALC) for controlling the output power of each power amplifier module PAM-1 through PAM-M. Briefly, an automatic level control loop controls the output power and provides the same balancing effect in relation to the output combiner. Consequently, the input splitter can be unbalanced since the ALC loop will compensate for any such imbalance by changing the gain of the various power amplifier modules. The resulting effect is the same—lower combining loss and improved IMD performance.

A main controller MC provides an ALC reference level signal AR to each of the power amplifier modules PAM-1 through PAM-M. The same reference level is supplied to each of the power amplifier modules and represents the same power level for all of the modules. Signal AR may take the form of a digital signal or an analog signal. As will be brought out with reference to module PAM-1, the output power of each of the modules will be the same under the control of the ALC loop.

Reference is now made to FIG. 18 which illustrates the power amplifier modules PAM-1 in greater detail. All of the modules are constructed in the same manner. The power amplifier module includes an RF input 310 for receiving a portion of the RF input signal from splitter S. This signal is supplied to a variable loss attenuator 312 which varies the signal in accordance with an attenuation control signal AC obtained from a difference circuit 314. The difference circuit 314 receives a power signal PS which is a voltage representative of the output power at the output circuit 316 of the power amplifier module. At the output circuit 316, a sample is obtained with a sampling device 318 and supplied to a wideband power detector 320 which provides a DC signal PS having a voltage proportional to that of the output power. The ALC reference signal AR is subtracted from the output power signal PS by the difference circuit 314 and the difference, which is an error signal, serves as the attenuation control signal AC that is supplied to the attenuator 312 to thereby adjust the input supplied to the eight-way power splitter 350 in accordance therewith.

The output circuit 316 is taken from the output of an eight-way signal combiner 360 which receives signals from the splitter 350 as amplified by eight amplifiers 400, 402, 404, 406, 408, 410, 412 and 414. The eight-way combiner 360 may be an unbalanced single section combiner such as the eight-way unbalanced combiner as illustrated in FIG. 15.

The eight-way input splitter 350 is preferably an eight-way balanced input splitter. This eight-way splitter is composed of seven balanced splitters including splitters 500, 502, 504, 506, 508, 510 and 512. These splitters are illustrated differently than those in FIG. 15 because while they are preferably balance splitters, they do not necessarily need to take the same form as that of the multi-section two-way splitters illustrated in FIG. 15. The splitters of FIG. 15 are the preferred form, however, these splitters could also be based on ferrite based directional couplers or two-way ninety degree splitters which are based on a wideband ferrite transformer with discrete components connected to the outputs to organize a wideband phase shifting network. All of these splitters should exhibit the response characteristics as illustrated in FIG. 10 and in FIG. 16. Thus, the splitters have a wideband flat response in the same manner as described herein with reference to the embodiment illustrated in FIG. 11.

The invention has been described in conjunction with preferred embodiments. However, it is to be appreciated that various modifications may be made without departing from the spirit and scope of the invention as defined by the appending claims.

Having described the invention, we claim:

1. An RF wideband amplifier system comprising:
   an M way splitter for receiving an RF input signal and splitting same into M RF signals for respective application to M power amplifier modules PAM-1 to PAM-M that amplify said M signals and apply the amplified M signals to an M way combiner that applies an amplified RF signal to a load;
   a single main controller that provides a single automatic level control reference signal, representative of the desired output power level of each of said power amplifier modules;
   each said power amplifier module including an 2*N way balanced splitter that receives one of said M RF signals and splits said signal into 2*N signal portions; 2*N RF amplifiers that respectively receive said 2* N signal portions and amplify same and provide therefrom 2*N amplified signal portions; an 2*N way RF combiner that receives and combines said amplified RF signal portions and provides therefrom a combined amplified output RF signal; a power detector that provides a power signal representative of the level of the output power of said power amplifier module; a difference circuit that provides an attenuation control signal having a value in accordance with the difference in values of said power signal and said reference signal; and, a variable adjuster that adjusts the magnitude of said one of said M RF signals in accordance with said difference.

2. A system as set forth in claim 1 in combination with said M power amplifier modules.

3. A system as set forth in claim 2 in combination with said M-way combiner.

4. A system as set forth in claim 1 including a signal sampling device that obtains a sample of said output RF signal and applies same to said power detector.

5. A system as set forth in claim 1 wherein said variable adjuster is a variable attenuator located at the input of each said balanced splitter to vary the magnitude of the RF signal applied thereto.

6. A system as set forth in claim 5 including circuitry for applying said power signal and said reference signal to said difference circuit.

7. A system as set forth in claim 6 including additional circuitry for applying said attenuation control signal to said variable attenuator.

8. A system as set forth in claim 1 wherein each said balanced splitter has an input port 1 and output ports 2 and 3 and optimized such that over an operating range of about 470 MHz to about 860 MHz the signal responses at said ports 2 and 3 with steady state input signal applied at port 1 are relatively flat.

9. A system as set forth in claim 8 wherein said flat responses at ports 2 and 3 deviated from each other by no more than about 0.1 dB.

10. A system as set forth in claim 9 wherein said balanced splitters include ferrite based directional couplers.

11. A system as set forth in claim 9 wherein said balanced splitters include wideband ferrite transformers.

12. A system as set forth in claim 1 wherein said balanced splitter has a corporate structure of consequent 2-way dividing stages including an input splitter section having a first input port and a reject load port and second and third output ports; said first input port and said second output port being interconnected by an RF transmission path that has an electrical length of 3, 5, 7 . . . quarter wavelengths, and said reject port and said third port being interconnected by an RF transmission path that has an electrical length of 3, 5, 7 . . . quarter wavelengths.

13. A system as set forth in claim 12 wherein said balanced splitter is optimized such that over an operating frequency range of about 470 MHz to 860 MHz the responses at said second and third output ports to a steady state input signal applied to said first input port are relatively flat and which flat responses deviate from each other by no more than about 0.1 dB.

* * * * *